(12) United States Patent
Casey et al.

(10) Patent No.: US 6,563,191 B1
(45) Date of Patent: May 13, 2003

(54) INTERDIGITATED CAPACITOR WITH DIELECTRIC OVERLAY

(75) Inventors: John F. Casey, Colorado Springs, CO (US); J. Mark Foster, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/690,075

(22) Filed: Oct. 16, 2000

(51) Int. Cl.[7] .................. H01L 29/00; H01L 27/108; H01L 29/76; H01L 29/94; H01L 31/119
(52) U.S. Cl. .................. 257/532; 257/296
(58) Field of Search .................. 257/295–310; 438/253–254, 396–398

(56) References Cited

U.S. PATENT DOCUMENTS 5,583,359 A * 12/1996 Ng et al. .................. 257/306

* cited by examiner

Primary Examiner—Cuong Quang Nguyen

(57) ABSTRACT

A preferred method includes providing a substrate and depositing a capacitor material upon the substrate. A portion of the capacitor material is then removed to form an interdigitated capacitor structure that incorporates a first contact and a second contact. Thereafter, a dielectric material is applied upon the interdigitated capacitor structure so that the structure is at least partially encapsulated by the substrate and the dielectric material. Capacitor structures also are provided.

11 Claims, 5 Drawing Sheets

INTERDIGITATED CAPACITOR WITH DIELECTRIC OVERLAY

BACKGROUND OF THE INVENTION

1. Field of the Invention

The present invention generally relates to capacitor structures and, in particular, to interdigitated capacitor structures incorporating overlays formed of dielectric materials and methods of manufacture.

2. Description of the Related Art

Reducing the size of electronic components oftentimes is problematic as performance characteristics of some of these components are directly related to their physical size. In regard to capacitors, for example, a reduction in the size of a capacitor, i.e., a reduction in the surface area of the plates of the capacitor, typically results in a loss of capacitance.

Heretofore, in applications where use of a capacitor is required and available space for the placement of such a capacitor is limited, interdigitated capacitor structures have been utilized. As is known, an interdigitated capacitor structure includes two contacts, which are spaced from each other, with each contact incorporating one or more protrusions or fingers that are adapted to be interdisposed or interdigitated relative to each other. Such a structure offers a circuit designer a range of flexibility as the capacitance of the structure may be adjusted by altering the spacing between the contacts as well as by changing the number of fingers of the contacts. However, inherent manufacturing considerations of interdigitated capacitors tend to limit the capacitance typically made available by such structures. Such considerations include difficulty in reducing spacing between the fingers of the contacts as the precision limits of an etching process utilized to form the fingers is approached, among others. Thus, heretofore, the limitations imposed upon interdigitated capacitor structures by manufacturing considerations, for example, has enabled such structures to provide only a relatively small improvement in capacitance as compared with other capacitor structures.

Therefore, there is a need for improved interdigitated capacitor structures and methods which address these and other shortcomings of the prior art.

SUMMARY OF THE INVENTION

Briefly described, the present invention relates to capacitor structures. In this regard, embodiments of the present invention may be construed as providing methods for forming interdigitated capacitors. In a preferred embodiment, the method includes providing a substrate and depositing a capacitor material upon the substrate. A portion of the capacitor material is then removed, such as by an etching process, to form an interdigitated capacitor structure that incorporates a first contact and a second contact. Thereafter, a dielectric material is applied upon the interdigitated capacitor structure so that the structure is at least partially encapsulated by the dielectric material upon the substrate.

Some embodiments of the present invention may be construed as providing interdigitated capacitor structures. A preferred interdigitated capacitor includes a substrate with first and second contacts formed thereon. Preferably, the first contact incorporates at least a first finger and a second finger, and the second contact incorporates least a first finger, with the fingers engaging each other in an interdigitated configuration. Additionally, a dielectric material is engaged about at least a portion of the first contact, the second contact, and the substrate so that the dielectric material and the substrate encapsulate at least a portion the first and second contacts.

An alternative embodiment of the interdigitated capacitor includes a substrate with first and second contacts formed thereon. Preferably, the first contact incorporates at least a first finger and a second finger, and the second contact incorporates at least a first finger, with the fingers engaging each other in an interdigitated configuration. Additionally, means for increasing capacitance of the interdigitated capacitor is provided.

Other features and advantages of the present invention will become apparent to one with skill in the art upon examination of the following drawings and detailed description. It is intended that all such features and advantages be included herein within the scope of the present invention, as defined in the appended claims.

BRIEF DESCRIPTION OF THE SEVERAL VIEWS OF THE DRAWINGS

The invention can be better understood with reference to the following drawings. The components in the drawings are not necessarily to scale, emphasis instead being placed upon clearly illustrating the principles of the present invention.

DETAILED DESCRIPTION OF A PREFERRED EMBODIMENT

Figure 1:
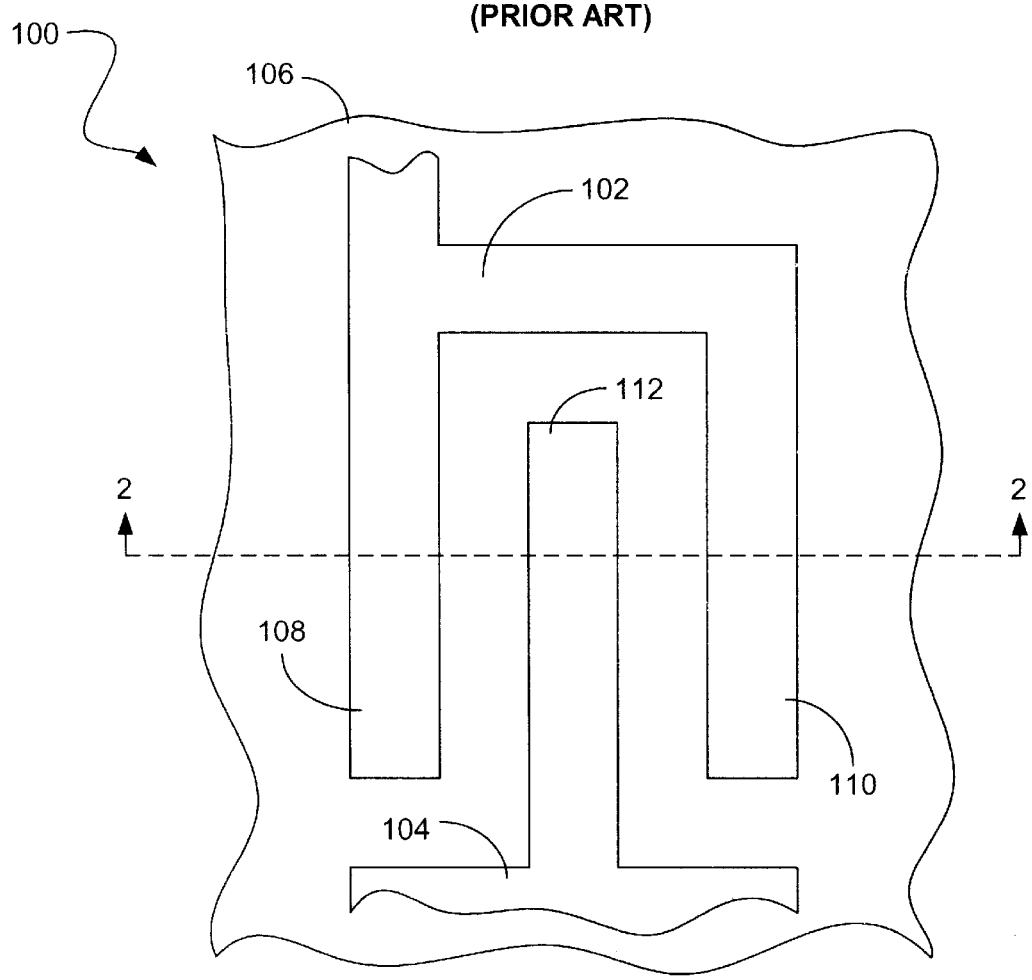
FIG. 1 is a cut-away schematic diagram depicting a top view of a representative prior art interdigitated capacitor structure.
Figure 2:
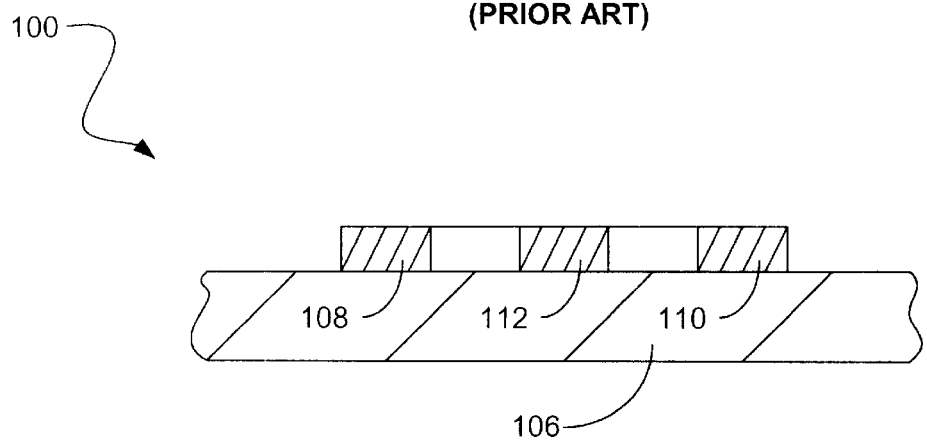
FIG. 2 is a side cross-sectional view of the structure depicted in FIG. 1 as viewed along section line 2—2.

Reference will now be made to the drawings wherein like numbers indicate corresponding parts throughout the several views. As depicted in FIG. 1, a representative prior art interdigitated capacitor structure 100 includes a first contact 102 and a second contact 104 which are spaced from each other. The contacts are formed upon a substrate 106, with contact 102 incorporating two fingers, i.e., fingers 108 and 110, and contact 104 incorporating one finger 112, although various other numbers of fingers may be utilized. The fingers 108, 110 and 112 are arranged in an interdigitated and spaced configuration upon substrate 106 (see also, FIG. 2) so that, when a potential difference is applied across the contacts, the structure exhibits a particular capacitance.

Figure 3:
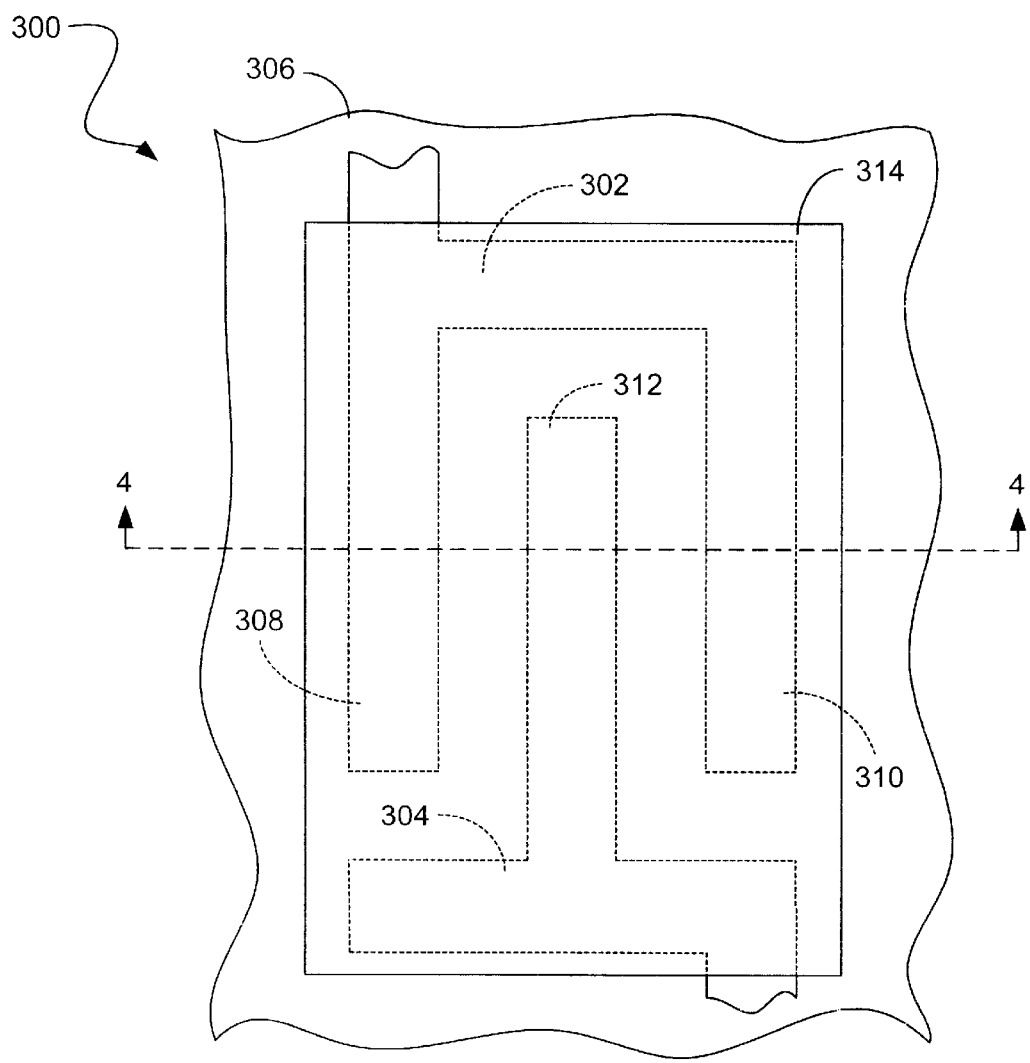
FIG. 3 is a cut-away schematic diagram depicting a top view of a preferred embodiment of the interdigitated capacitor stricture of the present invention.
Figure 4:
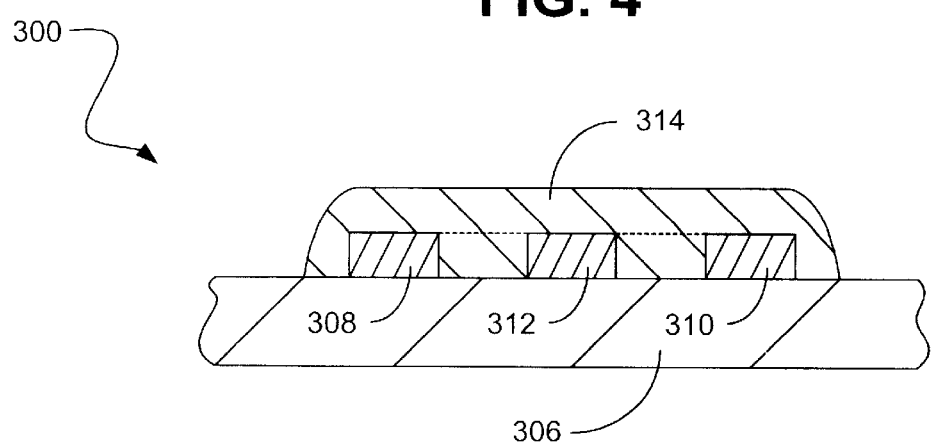
FIG. 4 is a side cross-sectional view of the structure depicted in FIG. 3 as viewed along section line 4—4.

Referring now to FIGS. 3 and 4, a preferred embodiment of an interdigitated capacitor structure 300 of the present invention will be described. As depicted in FIG. 3, capacitor structure 300 includes a first contact 302 and a second contact 304 which are spaced from each other. The contacts are formed upon a substrate 306 (a preferred method of manufacture being described in greater detail hereinafter). As shown in the embodiment of FIG. 3, contact 302 incorporates two fingers, i.e., fingers 308 and 310, and contact 304 incorporates one finger 312, with the fingers being arranged in an interdigitated configuration. Although the capacitor structure 300 is depicted as providing only three fingers, various other numbers of fingers, sizes of fingers, shapes of fingers, and finger spacings may be utilized and are considered well within the scope of the present invention. Capacitor structure 300 also includes at least a first dielectric overlay 314 which is formed over the various fingers, e.g., fingers 108, 110, and 112, of the contacts, thereby encapsulating the contacts between the overlay 314 and the substrate 306.

Figure 5:
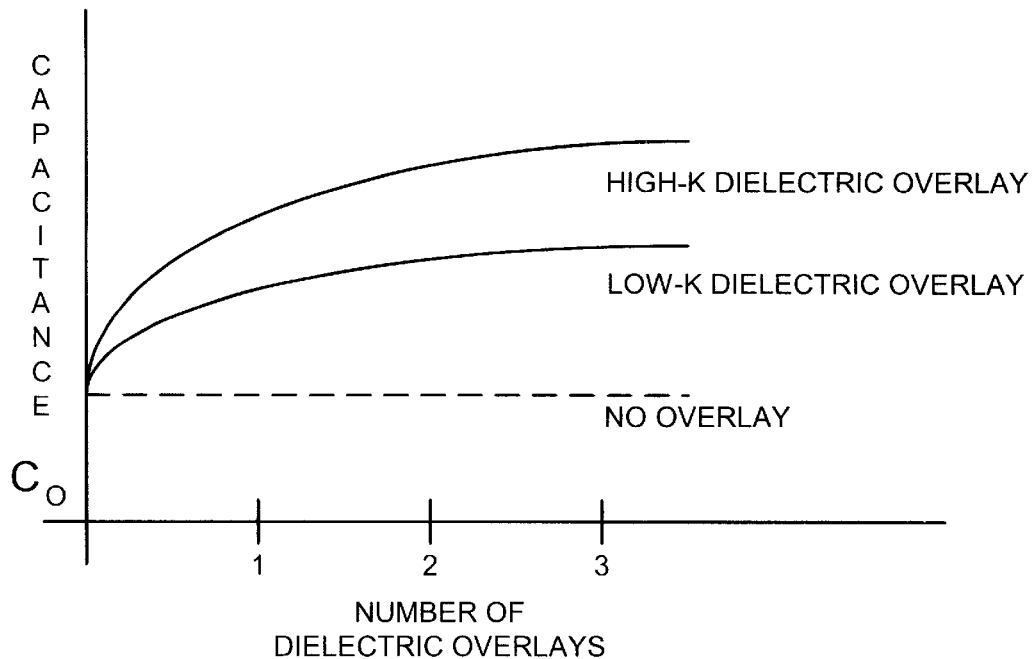
FIG. 5 is a graph depicting capacitance versus number of dielectric overlays.

As depicted in FIGS. 3 and 4, and graphed in FIG. 5, dielectric overlay(s) 314 provide the advantage of increasing the capacitance of the capacitor structure 300 while providing a potentially protective, encapsulating structure about the contacts. Given the relatively small thickness of the overlay(s) (as exhibited in preferred embodiments), a relatively small impact to the overall size of the structure, as compared to the structure without overlay(s), may be achieved. As is evident from the graph depicted in FIG. 5, greater increases in capacitance may be achieved in a particular capacitor structure by utilizing an overlay material having a higher dielectric constant and/or by increasing the number of dielectric overlays provided about the contacts. It should be noted that the thickness of the overlays represented in FIG. 5 are substantially equal. Additionally, after the accumulation of a relatively nominal thickness of dielectric material in the form of an overlay, the incremental gain in capacitance of the capacitor structure lessens with each additional dielectric overlay. Therefore, each dielectric possesses a corresponding limiting thickness. As utilized herein, the term "limiting thickness" is used to describe that thickness of dielectric above which only a negligible increase in capacitance may be achieved by adding more material, e.g., a greater thickness of dielectric, to the overlay(s). As described in detail hereinafter, preferred embodiments of the present invention take advantage of the limiting thickness characteristic associated with each dielectric material utilized.

Figure 6:
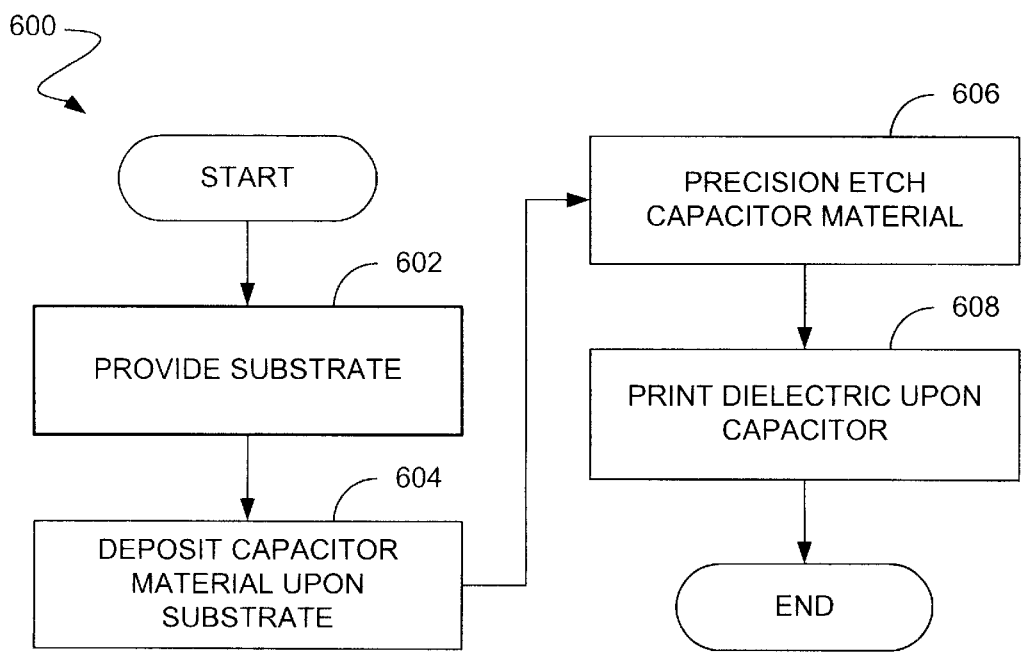
FIG. 6 is a flow chart depicting a preferred method of forming a interdigitated capacitor structure of the present invention.

Referring now to FIG. 6, a preferred method 600 of manufacturing an interdigitated capacitor structure of the present invention will be described in greater detail. As shown in FIG. 6, method 600 may be construed as beginning at block 602 where a substrate, such as a substrate formed of alumina ($Al_2O_3$), a ceramic, for example, is provided. Proceeding to block 604, a suitable capacitor material is deposited upon the substrate, such as by printing one or more layers of appropriate size and thickness of a photo-etchable metal paste, e.g., a photo-etchable gold metal paste. In block 606, the deposited capacitor material may then be precision etched, such as by photolithographic techniques, thereby allowing the formation of precise interdigitated capacitor structures.

In accordance with one such technique, the capacitor material is deposited upon the substrate and a photomask is applied to those portions of the material that are not to he etched away. An etchant is then applied, which removes the unmasked portions of the capacitor material, thereby forming the contacts and associated fingers of the interdipitated capacitor structure. Thereafter, as depicted in block 608, a dielectric material may be deposited upon the precision-formed interdigitated capacitor structure by printing or any other suitable technique.

It should be noted that depositing of the dielectric material upon the interdigitated capacitor structure need not be accomplished by utilizing a precision technique in which the thickness of the dielectric material may be accurately controlled. Preferably, the present invention makes use of the limiting effect of the thickness of the dielectric material, thereby enabling conventional thickfilm technology screen-printing methods, among others, to be utilized. More specifically, once a determination is made, such as during circuit design, for instance, as to the particular capacitor characteristics required of the capacitor structure to be manufactured, an appropriate dielectric material may be selected. Since the selected dielectric material possesses a corresponding limiting thickness, the capacitor structure preferably is designed so as to include the selected dielectric material as an overlay possessing at least the thickness associated with its limiting thickness. By so doing, various non-precision techniques for applying the dielectric overlay to the capacitor structure may be utilized provided that such techniques ensure that at least a minimum thickness, i.e., the limiting thickness, of the dielectric material is applied as an overlay.

For instance, if a given non-precision technique is known to apply only approximately one half of the desired thickness of the desired overlay, the technique may be utilized to apply the dielectric as two or more layers of the overlay, thereby ensuring that at least the limiting thickness is achieved. In this manner, the potential for the non-precision tolerances associated with the non-precision material application technique to negatively impact the capacitor structure may be reduced. Additionally, the decreasing slope of the Capacitance versus Number of Overlays curve depicted in FIG. 5 allows a designer to implement a design which is less sensitive to process variables.

Figure 7:
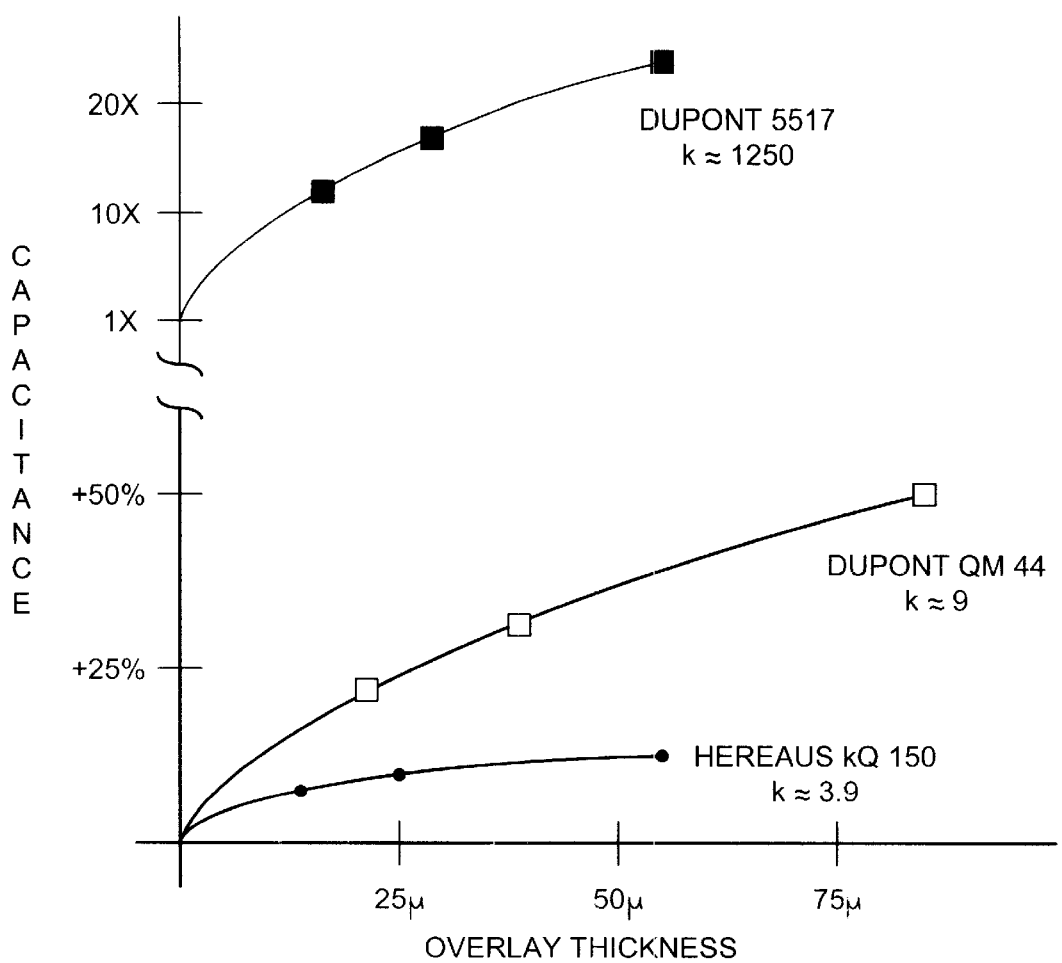
FIG. 7 is a graph depicting increase in capacitance versus overlay thickness.

As depicted in FIG. 7, different dielectric materials are capable of providing markedly different properties when utilized in an interdigitated capacitor structure of the present invention. Tables 1–3 are provided as representative examples of three different dielectric materials and characteristics when utilized in representative capacitor structures of the present invention.

TABLE 1

Capacitor Structure Formed with kQ 150 Overlay(s). (k = 3.9).

| $C_O$ | $C_F$ | % Δ | Overlay Thickness ($\mu$) | Avg. ΔC |
|---|---|---|---|---|
| 0.2958 | 0.2950 | −0.2 | 0.0 | −1.4% |
| 0.2986 | 0.3145 | +5.3 | 12.2 | |
| 0.3062 | 0.3145 | 3.6 | 12.2 | |
| 0.3189 | 0.3190 | 2.6 | 12.2 | +3.8% |
| 0.3243 | 0.3430 | | 24.6 | |
| 0.3235 | 0.3434 | | 24.6 | |
| 0.3177 | 0.3385 | | 24.6 | 6.1% |
| 0.3141 | 0.3535 | 12.2 | 53.6 | |
| 0.3120 | 0.3507 | 12.3 | 53.6 | |
| 0.3008 | 0.3438 | 14.3 | 53.6 | 12.9% |
| .3011 | .2935 | −2.5 | 0.0 | |

TABLE 2

Capacitor Structure Formed with QM 44 Overlay(s). (k = 9).

| $C_O$ | $C_F$ | % Δ | Overlay Thickness ($\mu$) | Avg. ΔC |
|---|---|---|---|---|
| 0.3097 | 0.2920 | −5.7 | 0 | −3% |
| 0.3144 | 0.3586 | 14.1 | 20.6 | |
| 0.3172 | 0.3675 | 15.9 | 20.6 | |

TABLE 2-continued

Capacitor Structure Formed with QM 44 Overlay(s). (k = 9).

| $C_O$ | $C_F$ | % Δ | Overlay Thickness (μ) | Avg. ΔC |
|---|---|---|---|---|
| 0.3218 | 0.3716 | 15.5 | 20.6 | +15.2% |
| 0.3143 | 0.4134 | 31.5 | 38.3 | |
| 0.3088 | 0.4111 | 33.1 | 38.3 | |
| 0.3126 | 0.3994 | 27.8 | 38.3 | 30.8% |
| 0.3054 | 0.4720 | 54.4 | 86.7 | |
| 0.3029 | 0.4654 | 53.5 | 86.7 | |
| 0.2981 | 0.4542 | 52.3 | 86.7 | 53.4% |
| 0.2938 | 0.2962 | −0.4 | 0 | |

TABLE 3

Capacitor Structure Formed with DuPont 5517 Overlay(s). (k = 1250).

| $C_O$ | $C_F$ | % Δ | Overlay Thickness (μ) | Avg. ΔC |
|---|---|---|---|---|
| 0.2979 | 0.2973 | −0.2 | 0 | −0.4% |
| 0.3067 | 3.0118 | +782 | 14.5 | |
| 0.3090 | 3.0680 | 792 | 14.5 | |
| 0.3182 | 3.0427 | 756 | 14.5 | |
| 0.3378 | 5.1220 | 1416 | 28.2 | |
| 0.3273 | 4.9930 | 1426 | 28.2 | |
| 0.3255 | 4.9240 | 1413 | 28.2 | |
| 0.3247 | 7.376 | 2072 | 55.4 | |
| 0.3213 | 7.322 | 2079 | 55.4 | |
| 0.3146 | 7.262 | 2108 | 55.4 | |
| 0.3040 | 0.3022 | −0.6 | | |

Optimization of material usage in a particular capacitor structure of the present invention may be based on numerous criteria including dielectric constant, material cost, ease of application as an overlay, etc.

Figure 8:
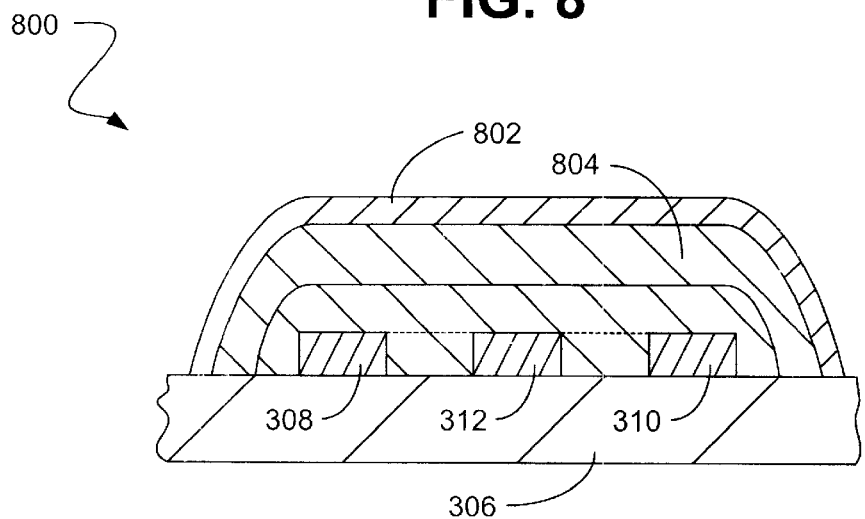
FIG. 8 is a cross-sectional side view of an alternative embodiment of the present invention.

Reference will now be made to FIG. 8 which depicts an alternative embodiment of the present invention. As shown in FIG. 8, shielded interdigitated capacitor structures incorporating dielectric overlays, e.g., capacitor structure 800, are provided. Capacitor structure 800, which is similar in all other respects to the capacitor structure shown and described in relation to FIGS. 3 and 4, incorporates a shield 802 that is formed above, e.g., upon, an uppermost dielectric overlay 804 of the structure. Such a shield may be formed of various materials, such as gold, for example.

Figure 9:
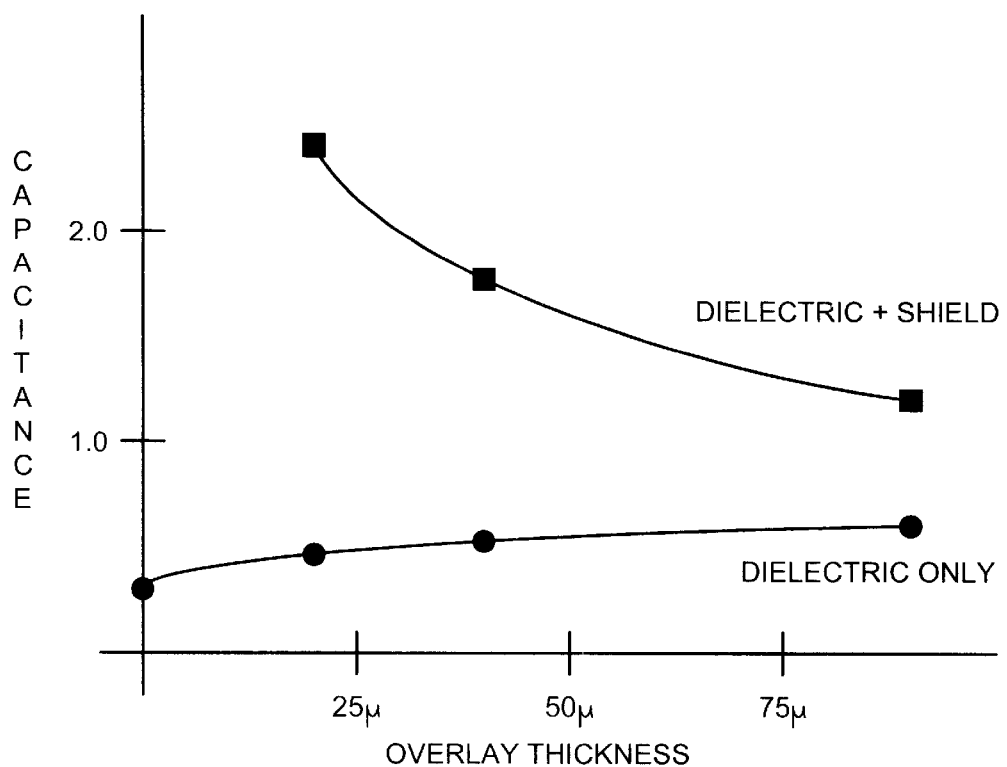
FIG. 9 is a graph depicting capacitance versus overlay thickness.

As depicted in FIG. 9, the shielded structure offers the advantage of increasing the capacitance of the interdigitated capacitor, as compared to the unshielded or dielectric-only structure, with the incremental increase in capacitance attributed to the shield diminishing as the thickness of the dielectric overlay(s) increases. Therefore, in addition to improving electrical isolation of the capacitor structure from external sources, the shielded structure also provides a way of "up-trimming" the capacitor, i.e., increasing the capacitance of the capacitor structure, without changing the basic layout or footprint of the structure. In particular, the size of the shield, e.g., the percentage of coverage over the capacitor fingers, may be utilized as a design parameter for capacitance control.

Figure 10:
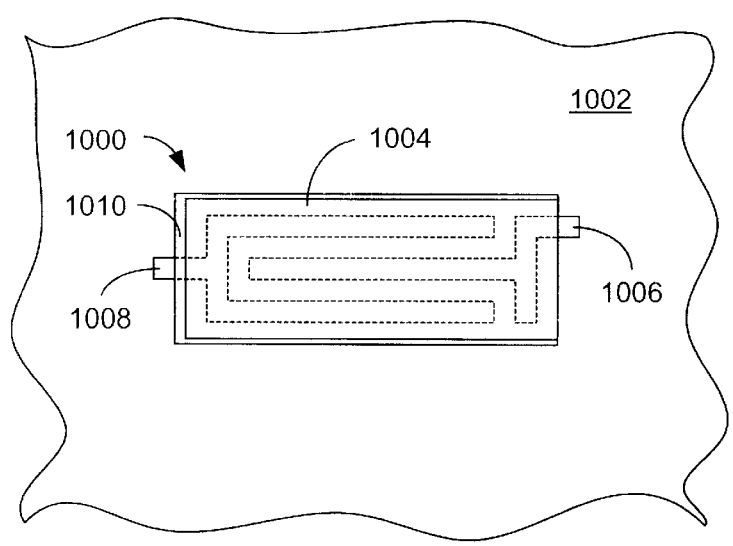
FIG. 10 is a schematic top view of a shielded interdigitated capacitor structure showing manufacturing detail.

Referring briefly to FIG. 10, a previously unshielded interdigitated capacitor structure 1000 is formed upon a substrate 1002. The interdigitated capacitor 1000 includes a first contact 1006 and a second contact 1008 and one or more dielectric overlays 1010. If it is determined that an increase in capacitance is required of the capacitor structure 1000, such as may be revealed during testing, i.e., after manufacture, a shield 1004 may be applied above the uppermost dielectric overlay of the structure, thereby potentially increasing the capacitance of the structure, as desired. As thickness of the material of the shield 1004 is not critical, provided that the thickness is reasonably uniform, non-precision application of the shield is not required. However, precision manufacture of the shield may result in predictable (C/unit area) design guidelines.

As depicted in the embodiment of FIG. 10, the shield 1004 is configured to electrically engage one, e.g., 1006, but not both of the contacts, although other embodiments may be configured with shields that do not electrically engage either contact of their respective structures. Additionally, it is desirable that the dielectric overlays of the structure include no holes, e.g., pinholes, that extend from the outer surface of the dielectric overlays to one or more of the encapsulated contacts as such holes may subject the structure to electrical shorts after the material of the shield has been printed thereon.

The foregoing description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated.

All such modifications and variations, are within the scope of the invention as determined by the appended claims when interpreted in accordance with the breadth to which they are fairly and legally entitled.

What is claimed is:

1. An interdigitated capacitor comprising:
    a substrate;
    a first contact formed on said substrate, said first contact having a first finger and a second finger, said first finger being spaced from said second finger;
    a second contact formed on said substrate and having a first finger, said first finger of said second contact being disposed at least partially between said first finger and said second finger of said first contact;
    a dielectric material engaging at least a portion of said first contact, said second contact, and said substrate such that said dielectric material and said substrate encapsulate at least a portion said first contact and said second contact; and
    a layer of conductive material engaging an upper surface of the dielectric material, said layer of conductive material increasing capacitance of the interdigitated capacitor as compared with the capacitance of the interdigitated capacitor prior to the layer being engaged therewith wherein the layer of conductive material does not electrically contact the first and second contacts, and end surfaces of the layer of conductive material directly contact an upper surface of the substrate.

2. The interdigitated capacitor of claim 1, wherein the dielectric material is at least as thick as a limiting thickness of the dielectric material.

3. The interdigitated capacitor of claim 1, wherein the dielectric material is configured as multiple overlays of the dielectric material.

4. An interdigitated capacitor comprising:

a substrate;

a first contact formed on said substrate, said first contact having a first finger and a second finger, said first finger being spaced from said second finger;

a second contact formed on said substrate and having a first finger, said first finger of said second contact being disposed at least partially between said first finger and said second finger of said first contact;

a dielectric material engaging at least a portion of said first contact, said second contact, and said substrate such that said dielectric material and said substrate encapsulate at least a portion said first contact and said second contact; and a shield formed as a layer of conductive material contacting an exterior surface of the dielectric material wherein the shield does not electrically contact to the first and second contacts, and end surfaces of the shield directly contact an upper surface of the substrate.

5. The interdigitated capacitor of claim 4, wherein said shield exhibits a substantially uniform thickness.

6. The interdigitated capacitor of claim 4, wherein said shield is comprised of gold.

7. The interdigitated capacitor of claim 4, wherein said dielectric material and said substrate encapsulate said first finger and said second finger of said first contact and said first finger of said second contact.

8. The interdigitated capacitor of claim 4, wherein the dielectric material is configured as multiple overlays.

9. The interdigitated capacitor of claim 4, wherein the dielectric material is a first dielectric material; and further comprising:

a second dielectric material contacting at least a portion of said first dielectric material.

10. The interdigitated capacitor of claim 9, wherein the second dielectric material and said substrate encapsulate said first and second fingers of said first contact, said first finger of said second contact and said first dielectric material.

11. The interdigitated capacitor of claim 4, wherein the dielectric material is at least as thick as a limiting thickness of the dielectric material.

* * * * *